US 8,212,251 B2

(12) United States Patent
Moriya et al.

(10) Patent No.: US 8,212,251 B2
(45) Date of Patent: Jul. 3, 2012

(54) ACTIVE MATRIX SUBSTRATE

(75) Inventors: Yoshimizu Moriya, Osaka (JP);
Mutsumi Nakajima, Osaka (JP);
Yasuyoshi Kaise, Osaka (JP); Makoto Kita, Osaka (JP); Hiroshi Matsukizono, Osaka (JP); Yoshiyuki Itoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 343 days.

(21) Appl. No.: 12/531,406

(22) PCT Filed: Feb. 29, 2008

(86) PCT No.: PCT/JP2008/053690
§ 371 (c)(1),
(2), (4) Date: Sep. 15, 2009

(87) PCT Pub. No.: WO2008/114599
PCT Pub. Date: Sep. 25, 2008

(65) Prior Publication Data
US 2010/0044710 A1 Feb. 25, 2010

(30) Foreign Application Priority Data
Mar. 16, 2007 (JP) ................. 2007-069141

(51) Int. Cl.
*H01L 27/15* (2006.01)
(52) U.S. Cl. .......................... 257/59; 257/72
(58) Field of Classification Search .......... 257/57, 257/72; 438/58, 143, 402, 473–474
See application file for complete search history.

(56) References Cited

U.S. PATENT DOCUMENTS

| 6,251,712 | B1 | 6/2001 | Tanaka et al. |
| 7,148,093 | B2 * | 12/2006 | Makita .................. 438/166 |
| 2001/0025992 | A1 | 10/2001 | Nakajima et al. |
| 2003/0201442 | A1 | 10/2003 | Makita |
| 2010/0006855 | A1 * | 1/2010 | Park et al. ............... 257/72 |

FOREIGN PATENT DOCUMENTS

| JP | 2003-303831 | 10/2003 |
| JP | 2006-128469 | 5/2006 |

OTHER PUBLICATIONS

International Search Report for PCT/JP2008/053690, mailed May 13, 2008.
English translation of the International Preliminary Report on Patentability mailed Oct. 1, 2009 in corresponding PCT application PCT/JP2008/053690.
U.S. Appl. No. 12/531,383, filed Sep. 15, 2009, entitled "Active Matrix Substrate".

* cited by examiner

*Primary Examiner* — Kiesha Bryant
*Assistant Examiner* — Mark Tornow
(74) *Attorney, Agent, or Firm* — Nixon & Vanderhye P.C.

(57) ABSTRACT

In an active-matrix substrate (100) according to the present invention, a semiconductor layer (110) has a first gettering region (112) adjacent to the source region (132) of a first thin-film transistor (130), a second gettering region (114) adjacent to the drain region (146) of a second thin-film transistor (140), and a third gettering region (116) adjacent to any of the source and drain regions located between the respective channel regions (134 and 144) of the first and second thin-film transistors (130 and 140) among the source and drain regions of the thin-film transistors included in the thin-film transistor element (120).

7 Claims, 6 Drawing Sheets

(a)

(b)

ACTIVE MATRIX SUBSTRATE

This application is the U.S. national phase of International Application No. PCT/JP2008/053690, filed 29 Feb. 2008, which designated the U.S. and claims priority to Japanese Patent Application No. 2007-069141, filed 16 Mar. 2007, the entire contents of each of which are hereby incorporated by reference.

TECHNICAL FIELD

The present invention relates to an active-matrix substrate for use in a liquid crystal display device and other devices.

BACKGROUND ART

Recently, techniques for forming a semiconductor layer with a crystal structure (which will be referred to herein as a "crystalline semiconductor layer") by crystallizing an amorphous semiconductor layer that has been deposited on an insulating substrate such as a glass substrate have been researched extensively. Examples of such crystalline semiconductor layers include polycrystalline semiconductor layers and microcrystalline semiconductor layers. A thin-film transistor (TFT) that has been fabricated with a crystalline semiconductor layer has far higher carrier mobility than a TFT that has been fabricated with an amorphous semiconductor layer. For that reason, pixel TFTs for the display area on an active-matrix substrate with a built-in driver, which can be used effectively in a display device (such as a liquid crystal display device), and driver TFTs for the peripheral area thereof are fabricated using a crystalline semiconductor layer.

As a technique for crystallizing an amorphous semiconductor layer, a continuous grain silicon (CGS) process, in which the amorphous semiconductor layer is heated with a catalyst element (such as nickel) added thereto, is known. According to such a technique, a crystalline semiconductor layer of good quality with aligned crystallographic plane orientations can be obtained in a short time and at a low temperature. However, in a situation where a crystalline semiconductor layer has been formed by the CGS process, if the catalyst element remains in the channel region, then the OFF-state current of TFTs might increase suddenly. To suppress such a sudden increase in OFF-state current, a countermeasure for providing a gettering region to remove the catalyst element by a gettering process is known (see Patent Document No. 1, for example). In the semiconductor device disclosed in Patent Document No. 1, a gettering region, to which a Group V element such as phosphorus has been introduced, is arranged around source/drain regions with contact portions. And a catalyst element remaining in the channel region of a crystalline semiconductor layer is removed under heat by the gettering process, thereby suppressing a sudden increase in the OFF-state current of a TFT.

Patent Document No. 1: Japanese Patent Application Laid-Open Publication No. 2006-128469

DISCLOSURE OF INVENTION

Problems to be Solved by the Invention

However, even in a situation where the gettering regions are arranged as in the semiconductor device disclosed in Patent Document No. 1, if the catalyst element has not been removed sufficiently from the channel region by the gettering process, then the OFF-state current of TFTs could still increase suddenly.

Also, while TFTs having a gate-drain overlapped lightly doped drain (GOLDD) structure with good long-term reliability are used effectively as driver TFTs for an active-matrix substrate, TFTs having a lightly doped drain (LDD) structure that can reduce OFF-state current and can stabilize the breakdown voltage are used effectively as pixel TFTs. In a TFT with the LDD structure, a lightly doped region is arranged in its semiconductor layer so as not to overlap with the gate electrode. That is why the distance between a region of the semiconductor layer that overlaps with the gate electrode (i.e., channel region) and the gettering region is longer in a pixel TFT in the display area than in a driver TFT in the peripheral area. As a result, the gettering process often cannot get done completely in the pixel TFT. If the OFF-state current increased suddenly in a pixel TFT, then a point defect would be produced in the display device. For example, if the display device is a normally black mode liquid crystal display device, a point that is slightly darker than surrounding pixels is produced when a half scale tone is displayed (i.e., when a potential difference is recognizable most easily). On the other hand, if the display device is a normally white mode liquid crystal display device, a point that is slightly brighter than the surrounding pixels is produced.

It is therefore an object of the present invention to provide an active-matrix substrate including a TFT, in which a sudden increase in the OFF-state current is reduced.

Means for Solving the Problems

An active-matrix substrate according to the present invention includes: a semiconductor layer; a thin-film transistor element including first and second thin-film transistors, each of which has a source region, a channel region and a drain region that are included in the semiconductor layer; a gate bus line; a source bus line; and a pixel electrode. The first and second thin-film transistors are arranged in series with each other. The first thin-film transistor is located at one end, while the second thin-film transistor is located at the other end. The source region of the first thin-film transistor includes a source contact portion. The drain region of the second thin-film transistor includes a drain contact portion. The semiconductor layer has a first gettering region adjacent to the source region of the first thin-film transistor, a second gettering region adjacent to the drain region of the second thin-film transistor, and a third gettering region adjacent to any of the source and drain regions located between the respective channel regions of the first and second thin-film transistors among the source and drain regions of the thin-film transistors included in the thin-film transistor element.

In one preferred embodiment, at least a portion of the semiconductor layer overlaps with the source bus line.

In one preferred embodiment, at least a part of the third gettering region overlaps with the source bus line.

In one preferred embodiment, the semiconductor layer has a first end portion, a second end portion and an intermediate portion between the first and second end portions, and a part of the source region of the first thin-film transistor and the first gettering region are located in the first end portion.

In one preferred embodiment, a part of the drain region of the second thin-film transistor is located in the second end portion. A part of the source region and the entire channel and drain regions of the first thin-film transistor and a part of the drain region and the entire channel and source regions of the second thin-film transistor are located in the intermediate portion. The second gettering region is located in the second end portion and the third gettering region is located in the intermediate portion.

In one preferred embodiment, a part of the drain region of the second thin-film transistor is located in the second end portion. A part of the source region and the entire channel and drain regions of the first thin-film transistor and a part of the drain region and the entire channel and source regions of the second thin-film transistor are located in the intermediate portion. And the second and third gettering regions are both located in the intermediate portion.

In one preferred embodiment, the intermediate portion has: a first linear portion running in a first direction; a second linear portion running in a second direction that is different from the first direction; and a connecting portion that connects the first and second linear portions together. The third gettering region is adjacent to the connecting portion.

Effects of the Invention

The present invention provides an active-matrix substrate including a TFT, in which a sudden increase in the OFF-state current is reduced.

BRIEF DESCRIPTION OF DRAWINGS

FIG. 1 schematically illustrates an active-matrix substrate as a first specific preferred embodiment of the present invention, wherein FIG. 1(a) is a schematic plan view and FIG. 1(b) is a schematic cross-sectional view as viewed on the plane A-A' shown in FIG. 1(a).

Figure 1:
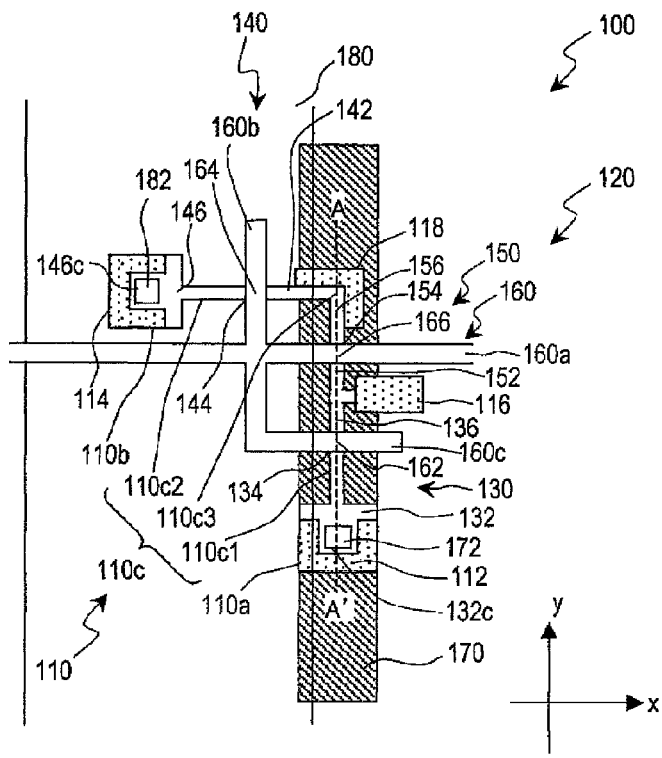
Figure 1:
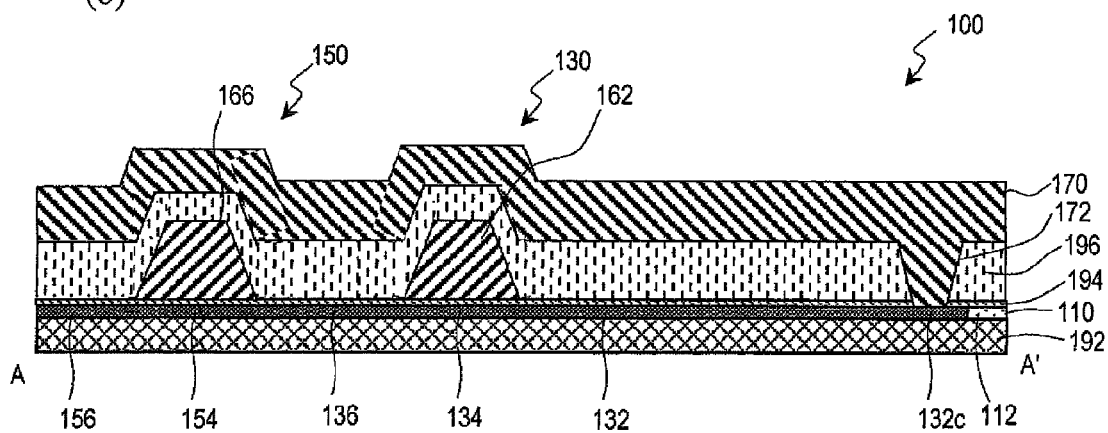

DESCRIPTION OF REFERENCE NUMERALS 100 active-matrix substrate
110 semiconductor layer
112, 114, 115, 116, 118 gettering region
120 TFT element
130, 140, 150 TFT
132, 142, 152 source region
132c source contact portion
134, 144, 154 channel region
136, 146, 156 drain region
146c drain contact portion
160 gate bus line
162, 164, 166 gate electrode
170 source bus line
172 source electrode
180 pixel electrode
182 drain electrode

BEST MODE FOR CARRYING OUT THE INVENTION

Hereinafter, preferred embodiments of an active-matrix substrate according to the present invention will be described with reference to the accompanying drawings. It should be noted, however, that the present invention is in no way limited to the specific preferred embodiments to be described below.

(Embodiment 1)

A first specific preferred embodiment of an active-matrix substrate according to the present invention will be described now. FIG. 1 schematically illustrates an active-matrix substrate 100 as a first specific preferred embodiment of the present invention, wherein FIG. 1(a) is a schematic plan view of the active-matrix substrate 100, and FIG. 1(b) is a schematic cross-sectional view as viewed on the plane A-A' shown in FIG. 1(a).

As shown in FIG. 1, the active-matrix substrate 100 of this preferred embodiment includes a semiconductor layer 110, a thin-film transistor element 120 (which will be referred to herein as "TFT element") including first, second and third thin-film transistors 130, 140 and 150, a gate bus line 160, a source bus line 170 and a pixel electrode 180. These three thin-film transistors 130, 140 and 150 of the TFT element 120 are arranged in series with each other. And the TFT 130 is arranged at one end, while the TFT 140 is arranged at the other end. Thus, the TFTs 130, 150 and 140 are arranged in this order from the source contact portion 132c toward the drain contact portion 146c. As a number of TFTs are arranged in series with each other in this manner, the OFF-state current of the TFT element 120 can be minimized.

The source, channel and drain regions 132, 134 and 136 of the first thin-film transistor 130, the source, channel and drain regions 142, 144 and 146 of the second thin-film transistor 140, and the source, channel and drain region 152, 154 and 156 of the third thin-film transistor 150 are included in the semiconductor layer 110. The source region 132 of the TFT 130 includes a source contact portion 132c in contact with a source electrode 172 that is electrically connected to the source bus line 170. Meanwhile, the drain region 146 of the TFT 140 includes a drain contact portion 146c in contact with a drain electrode 182 that is electrically connected to the pixel electrode 180. Also, the drain region 136 of the TFT 130 and the source region 152 of the TFT 150 are continuous with each other. And the drain region 156 of the TFT 150 and the source region 142 of the TFT 140 are also continuous with each other.

The semiconductor layer 110 has been made by a CGS process using nickel as a catalyst element. Also, the semiconductor layer 110 has first and second gettering regions 112 and 114 for removing the catalyst element by gettering. Although the source and drain regions of a TFT could sometimes perform gettering for removing a catalyst element, the "gettering regions" of this preferred embodiment have a gettering element at a higher concentration than the source and drain regions. The gettering region 112 is adjacent to the source region 132 of the TFT 130, while the gettering region 114 is adjacent to the drain region 146 of the TFT 140.

In the active-matrix substrate 100 of this preferred embodiment, the semiconductor layer 110 further has third and fourth gettering regions 116 and 118 that are arranged between the respective channel regions 134 and 144 of the TFTs 130 and 140. The gettering region 116 is adjacent to either the drain region 136 of the TFT 130 or the source region 152 of the TFT 150. And the gettering region 118 is adjacent to either the drain region 156 of the TFT 150 or the source region 142 of the TFT 140.

The semiconductor layer 110 has three portions, namely, a first end portion 110a, a second end portion 110b and an intermediate portion 110c between the first and second end portions 110a and 110b. In the first end portion 110a, located are a part of the source region 132, including the source contact portion 132c, and the first gettering region 112. On the other hand, in the second end portion 110b, located are a part of the drain region 146, including the drain contact portion 146c, and the second gettering region 114. And in the intermediate portion 110c, located are a part of the source region 132 and the entire channel and drain regions 134 and 136 of the TFT 130, a part of the drain region 146 and the entire channel and source regions 144 and 142 of the TFT 140, the source, channel and drain regions 152, 154 and 156 of the TFT 150, and the third and fourth gettering regions 116 and 118. Thus, in the active-matrix substrate 100 of this preferred embodiment, not only the first and second gettering regions 112 and 114 are arranged in the end portions 110a and 110b of the semiconductor layer 110 but also the third and fourth gettering regions 116 and 118 are arranged in the intermediate portion 110c of the semiconductor layer 110 as well.

The distance between the channel region 134 of the TFT 130 and the first gettering region 112 may be 7 to 10 μm, while the distance between the channel region 134 of the TFT 130 and the third gettering region 116 may be 5.5 to 6.5 μm, for example. Also, the distance between the channel region 144 of the TFT 140 and the second gettering region 114 may be 7 to 10 μm, while the distance between the channel region 144 of the TFT 140 and the fourth gettering region 118 may be 5 to 7 μm, for example. Thus, the third and fourth gettering regions 116 and 118 are arranged closer to the channel regions 134 and 144, respectively, than the first and second gettering regions 112 and 114 are. Furthermore, the distance between the channel region 154 of the TFT 150 and the third gettering region 116 may be 5.5 to 6.5 μm, while the distance between the channel region 154 of the TFT 150 and the fourth gettering region 118 may be 5 to 7 μm, for example. By arranging the third and fourth gettering regions 116 and 118 closer to the channel region 134, 144 and 154 in this manner, the catalyst element remaining in the channel regions 134, 144 and 154 can be removed sufficiently by the gettering process, thus suppressing the sudden increase in the OFF-state current of the TFTs.

Figure 2:
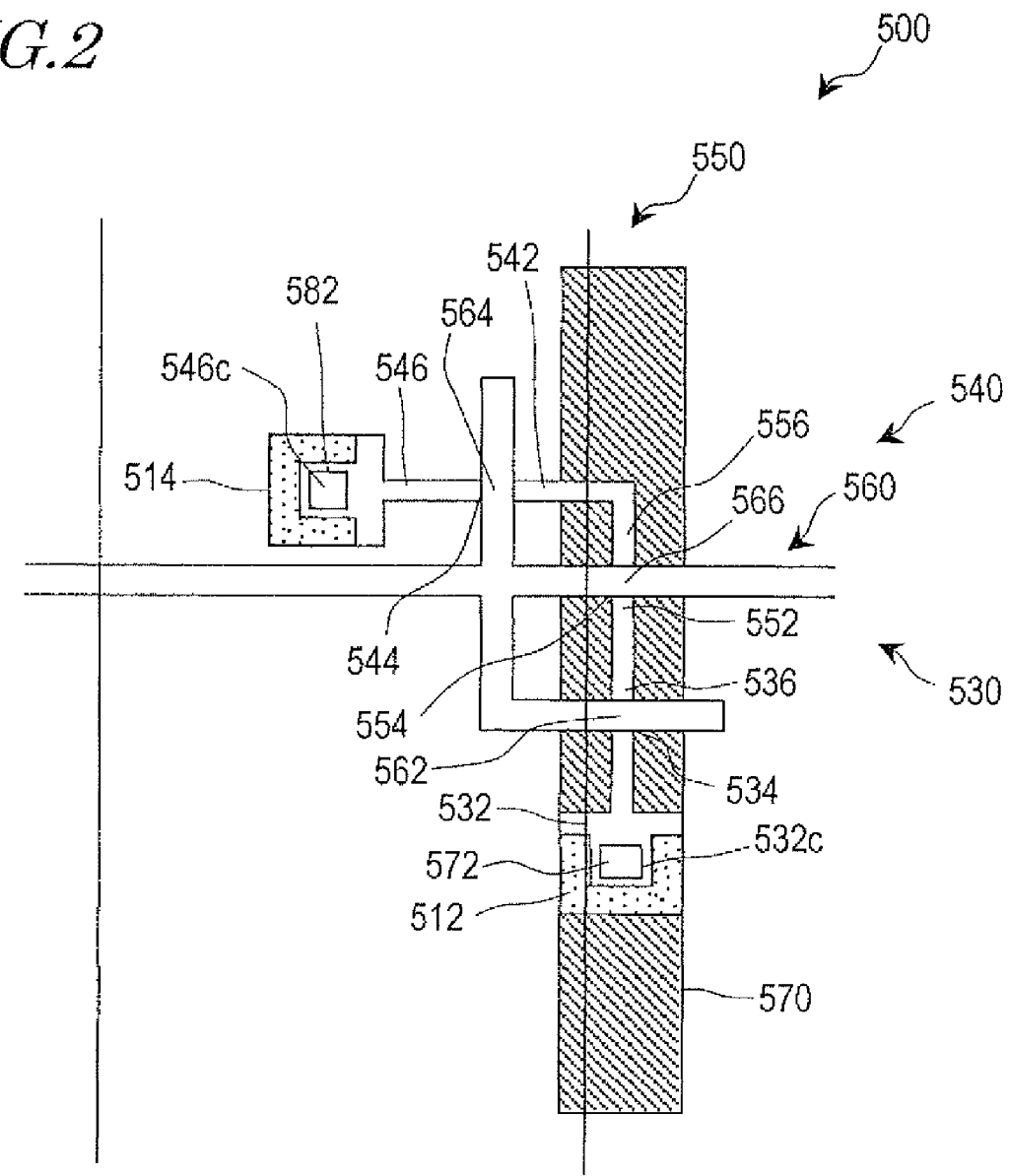
FIG. 2 is a schematic plan view illustrating an active-matrix substrate as a comparative example.

Hereinafter, the advantages of the active-matrix substrate 100 of this preferred embodiment over an active-matrix substrate 500 as a comparative example will be described. FIG. 2 is a schematic plan view illustrating the active-matrix substrate 500 as a comparative example. The active-matrix substrate 500 of this comparative example has the similar configuration as the active-matrix substrate 100 shown in FIG. 1 except that the active-matrix substrate 500 does not include the third and fourth gettering regions 116 and 118.

Suppose normally white mode display devices are fabricated using the active-matrix substrate 100 of the first preferred embodiment and the active-matrix substrate 500 as Comparative Example 1. In that case, if the gettering process was done insufficiently, the OFF-state current would increase suddenly to produce a bright point.

The following Table 1 shows how often bright points were produced in display devices that used the active-matrix substrate 100 of the first preferred embodiment and display devices that used the active-matrix substrate 500 of Comparative Example 1 along with the sensibility levels of those bright points:

TABLE 1

| Sensibility level | Embodiment 1 | Comparative Example 1 |
| --- | --- | --- |
| Level 1 | 96.9% | 78.1% |
| Level 2 | 1.7% | 17.2% |
| Level 3 | 1.4% | 4.7% |

In Table 1, "Embodiment 1" shows the results obtained from display devices that used the active-matrix substrate 100, while "Comparative Example 1" shows the results obtained from display devices that used the active-matrix substrate 500. The sensibility levels were determined in the following manner. Specifically, devices that produced no sensible bright points when viewed directly without using a filter were determined to have "Sensibility Level 1". Devices that allowed the viewer sense some bright points with no filters but that no longer produced sensible bright points when a neutral density (ND) filter for decreasing transmitted light to 10% (which will be referred to herein as a "10% ND filter") was used were determined to have "Sensibility Level 2". And devices that allowed the viewer sense some bright points even when such a 10% ND filter was used were determined to have "Sensibility Level 3". That is to say, the higher the sensibility level, the higher the intensity of the bright points produced.

As can be seen easily from Table 1, bright points were produced much less often in the display devices that used the active-matrix substrate of the first preferred embodiment than in the display devices that used the substrate of Comparative Example 1. This means that the sudden increase in OFF-state current was suppressed in the active-matrix substrate 100. Consequently, the active-matrix substrate 100 of this preferred embodiment has the third and fourth gettering regions 116 and 118, and therefore, would cause such a sudden increase in the OFF-state current of TFTs far less often than the active-matrix substrate 500 of the comparative example.

Now look at FIG. 1 again. As shown in FIG. 1(a), the gate bus line 160 has a trunk portion 160a running in the x direction, a branch portion 160b extending from the trunk portion 160a and running in the y direction, and another branch portion 160c extending from the trunk portion 160a in the y direction opposite to the branch portion 160b and also running in the x direction. And each of the trunk and branch portions 160a, 160b and 160c overlaps with the semiconductor layer 110 at a single point. A part of the semiconductor layer 110 overlapped by the gate bus line 160 functions as a channel region. And there are three channel regions 134, 144 and 154 in the semiconductor layer 110. Of these three channel regions 134, 144 and 154, the channel region 134 is located closest to the gettering region 112, while the channel region 144 is located closest to the gettering region 114. Also, portions of the gate bus line 160 associated with the channel regions 134, 144 and 154 will function as the gate electrodes 162, 164 and 166 of the TFTs 130 and 140, respectively.

The first gettering region 112 is arranged in the outer periphery of the first end portion 110a so as not to block the electrical charge path leading from the source contact portion 132c to the channel region 134. Likewise, the second gettering region 114 is arranged in the outer periphery of the second end portion 110b so as not to block the electrical charge path leading from the channel region 144 to the drain contact portion 146c. The first gettering region 112 is arranged in contact with one side of the rectangular first end portion 110a that is located closer to the channel region 134, while the second gettering region 114 is arranged in contact with one side of the rectangular second end portion 110b that is located closer to the channel region 144.

Also, the intermediate portion 110c of the semiconductor layer 110 has a first linear portion 110c1 running in the y direction, a second linear portion 110c2 running in the x direction, and a connecting portion 110c3 that connects the first and second linear portions 110c1 and 110c2 together. The third gettering region 116 is branched from the first linear portion 110c1 to run in the x direction. On the other hand, the fourth gettering region 118 is adjacent to the connecting portion 110c2.

Also, supposing a dimension of the semiconductor layer 110 that is perpendicular to the direction in which electrical charge flows from the source contact portion 132c toward the drain contact portion 146c is the "width", the width of the first end portion 110a (i.e., the length of the first end portion 110a as measured in the x direction) and that of the second end portion 110b (i.e., the length of the second end portion 110b as measured in the y direction) are both 8.5 to 10.5 µm. Also, the intermediate portion 110c except the third and fourth gettering regions 116 and 118 (i.e., the first and second linear portions 110c1 and 110c2 thereof) has an L shape running in the x and y directions and the first and second linear portions 110c1 and 110c2 have a constant width of 3 to 4 µm. Thus, the first and second end portions 110a and 110b have a greater width than the first and second linear portions 110c1 and 110c2. In this manner, the third and fourth gettering regions 116 and 118 are provided for the intermediate portion 110c while securing an electrical charge path. The source and drain contact portions 132c and 146c have a length of 4 µm in both of the x and y directions.

Also, in general, if light were incident on the channel region of a TFT, the TFT might malfunction. That is why to prevent external light incident on the monitor screen of a display device or the light that has been emitted from a backlight and then reflected from entering the channel regions 134 and 154 of the TFTs 130 and 150, the source bus line 170 is arranged so as to overlap with the channel regions 134 and 154. In this manner, such a malfunction can be eliminated. Also, by cutting off the incoming light with the source bus line 170 instead of providing an opaque layer separately, the aperture ratio will never decrease and no leakage current will flow from the source electrode 172. Furthermore, a gettering region has a different transmittance from the other regions. For that reason, if a gettering region is located in a range where light is transmitted, then the display quality could be debased to make it necessary to shield the gettering region from the light. In view of this consideration, by overlapping a part of the intermediate portion 110c and the first end portion 110a of the semiconductor layer 110 with the source bus line 170, each of the first, third and fourth gettering regions 112, 116 and 118 overlaps with the source bus line 170 at least partially. As a result, the decrease in aperture ratio can be suppressed.

Although FIG. 1 illustrates only the display area of the active-matrix substrate 100, the active-matrix substrate may also have a built-in driver, and gate and source drivers with TFTs may be integrated together in the peripheral area thereof. In that case, the semiconductor layer of TFTs for use in those drivers (which will be referred to herein as "driver TFTs") may also be made by the CGS process as in the display area. In the driver TFTs, the distance between the channel and gettering regions is usually 1 to 3 µm, for example, which is shorter than in pixel TFTs. Such an active-matrix substrate 100 may be used in a liquid crystal display device, for instance.

Figure 3:
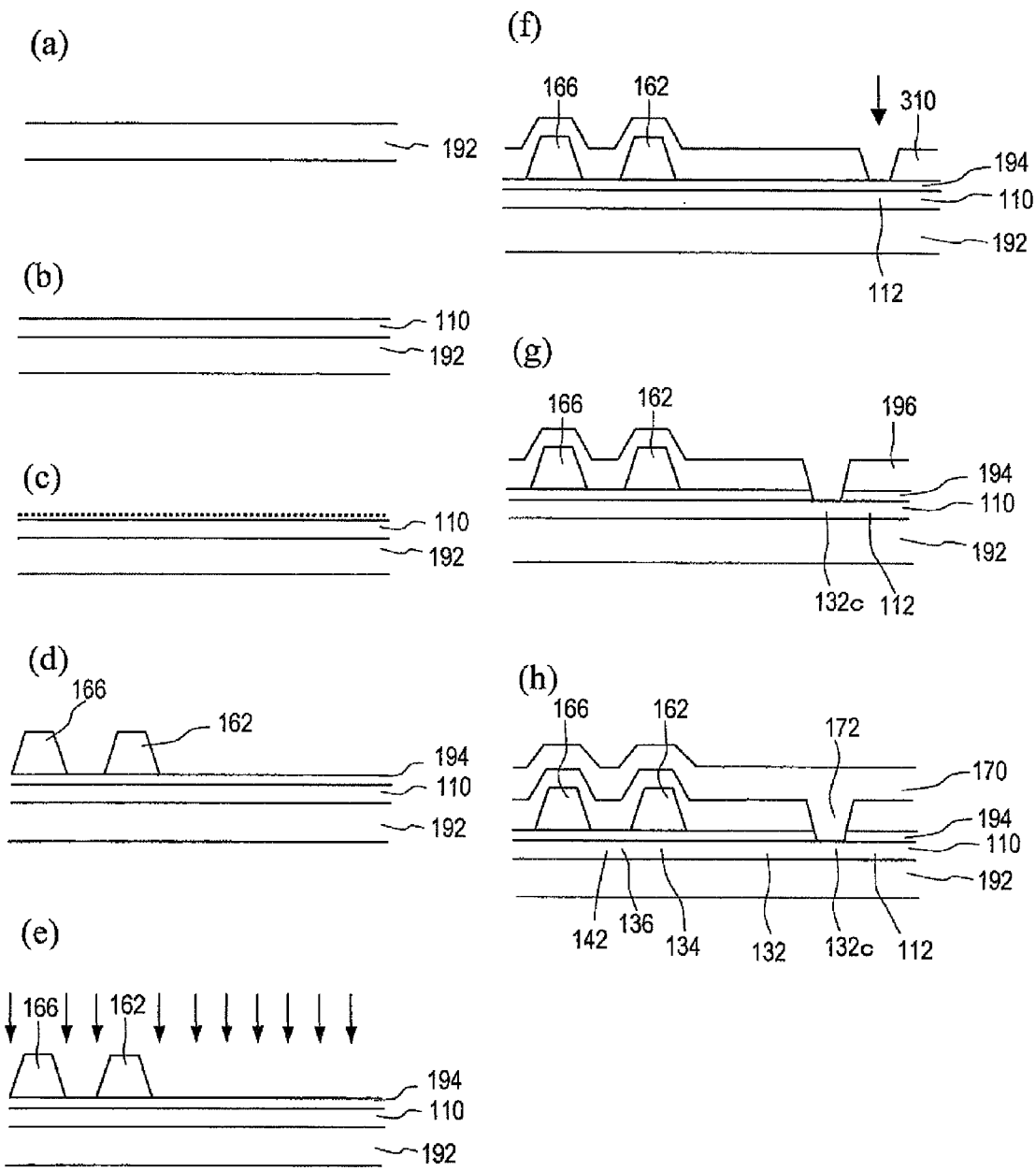
FIGS. 3(a) through 3(h) are schematic views illustrating respective manufacturing process steps to make an active-matrix substrate according to the first preferred embodiment.

Hereinafter, it will be described with reference to FIG. 3 how to make the active-matrix substrate of this preferred embodiment. FIGS. 3(a) through 3(h) are cross-sectional views as viewed on the same plane as FIG. 1(b).

First of all, an insulating substrate 192 is provided as shown in FIG. 3(a). The insulating substrate 192 may be a glass substrate, for example.

Next, as shown in FIG. 3(b), a base coating film (not shown) is deposited on the insulating substrate 192 and then a semiconductor layer 110 is deposited on the base coating film. In this process step, the semiconductor layer is an amorphous semiconductor layer.

Subsequently, as shown in FIG. 3(c), a catalyst element is added to the semiconductor layer 110. The catalyst element may be nickel, for example. Nickel may be added by applying an aqueous solution of nickel acetate over the surface of the semiconductor layer 110 uniformly and then drying it.

Next, the semiconductor layer 110 is heated to get crystallized and be a crystalline semiconductor layer. Then, the semiconductor layer 110 is patterned, thereby forming the end portions 110a and 110b and intermediate portion 110c of the semiconductor layer 110 shown in FIG. 1(a).

Thereafter, as shown in FIG. 3(d), a gate insulating film 194 is formed on the semiconductor layer 110. Subsequently, a conductive material is deposited on the gate insulating film 194 and then patterned to form a gate bus line 160.

Next, as shown in FIG. 3(e), a dopant is introduced into the semiconductor layer 110 using the gate bus line 160 as a mask. As a result, the dopant gets introduced into portions of the semiconductor layer 110 to be the source and drain regions 132 and 136 of the TFT 130, the source and drain regions 142 and 146 of the TFT 140, and the source and drain regions 152 and 156 of the TFT 150 shown in FIG. 1(a). If n-channel TFT element is going to be fabricated as the TFT element 120, the dopant may be phosphorus, for example. On the other hand, if p-channel TFT element is going to be fabricated as the TFT element 120, the dopant may be boron, for example. The source regions 132, 142, 152 and drain regions 136, 146, 156 of the TFTs 130, 140 and 150 may have a dopant concentration of 2 to $3\times10^{20}$ atoms/cm$^3$, for example.

Subsequently, as shown in FIG. 3(f), the semiconductor layer 110 is covered with a resist mask 310 with a predetermined opening and then selected areas of the semiconductor layer 110 are doped with a gettering element, which may be phosphorus, for example. As a result of this doping process, the first, second, third and fourth gettering regions 112, 114, 116 and 118 shown in FIG. 1(a) are included. In the first, second, third and fourth gettering regions 112, 114, 116 and 118, the gettering element may have a concentration of $6\times10^{20}$ to $1\times10^{21}$ atoms/cm$^3$, for example.

Thereafter, a gettering process is carried out by heating the semiconductor layer 110. Consequently, the catalyst element left in the source region 132 of the TFT 130 shown in FIG. 1(a) is removed mostly into the first gettering region 112. The catalyst element left in the channel and drain regions 134 and 136 of the TFT 130 and the source and channel regions 152 and 154 of the TFT 150 is removed mostly into the third gettering region 116. The catalyst element left in the drain region 156 of the TFT 150 and the source and channel regions 142 and 144 of the TFT 140 is removed mostly into the fourth gettering region 118. And the catalyst element left in the drain region 146 of the TFT 140 is removed mostly into the second gettering region 114.

Subsequently, an interlayer dielectric film 196 is deposited and etched as shown in FIG. 3(g), thereby exposing the source and drain contact portions 132c and 146c of the semiconductor layer 110 shown in FIG. 1(a).

After that, a conductive material is deposited and then patterned, thereby forming a source electrode 172 and a source bus line 170 as shown in FIG. 3(h). At the same time, a part of the drain electrode 182 (see FIG. 1(a)) is also formed. Thereafter, another interlayer dielectric film (not shown) is deposited and then the rest of the drain electrode 182 and a pixel electrode 180 shown in FIG. 1(a) are formed thereon. In this manner, the active-matrix substrate 100 is completed.

The manufacturing process of the active-matrix substrate 100 of the preferred embodiment described above is the same as that of the active-matrix substrate of the comparative example except that the intermediate portion 110c of the semiconductor layer 110 is patterned to form the third and fourth gettering regions 116 and 118 and that a resist mask 310 with an opening that will define the third and fourth gettering regions 116 and 118 is provided. That is why the active-matrix substrate 100 of this preferred embodiment can be fabricated using existent equipment effectively and without changing the design significantly.

(Embodiment 2)

In the active-matrix substrate of the first preferred embodiment described above, the TFT element includes three TFTs. However, the present invention is in no way limited to that specific preferred embodiment. Naturally, the TFT element of the active-matrix substrate may include only two TFTs.

Also, in the active-matrix substrate of the first preferred embodiment described above, a number of gettering regions are arranged between the respective channel regions of two TFTs that are located at both ends of a serial arrangement of multiple TFTs. However, the present invention is in no way limited to that specific preferred embodiment, either. Only one gettering region could be arranged between the respective channel regions of those two TFTs at both ends.

Furthermore, in the active-matrix substrate of the first preferred embodiment described above, the gettering region is arranged around the drain contact portion. However, the present invention is in no way limited to that specific preferred embodiment, either. Alternatively, there may be no gettering region around the drain contact portion.

Figure 4:
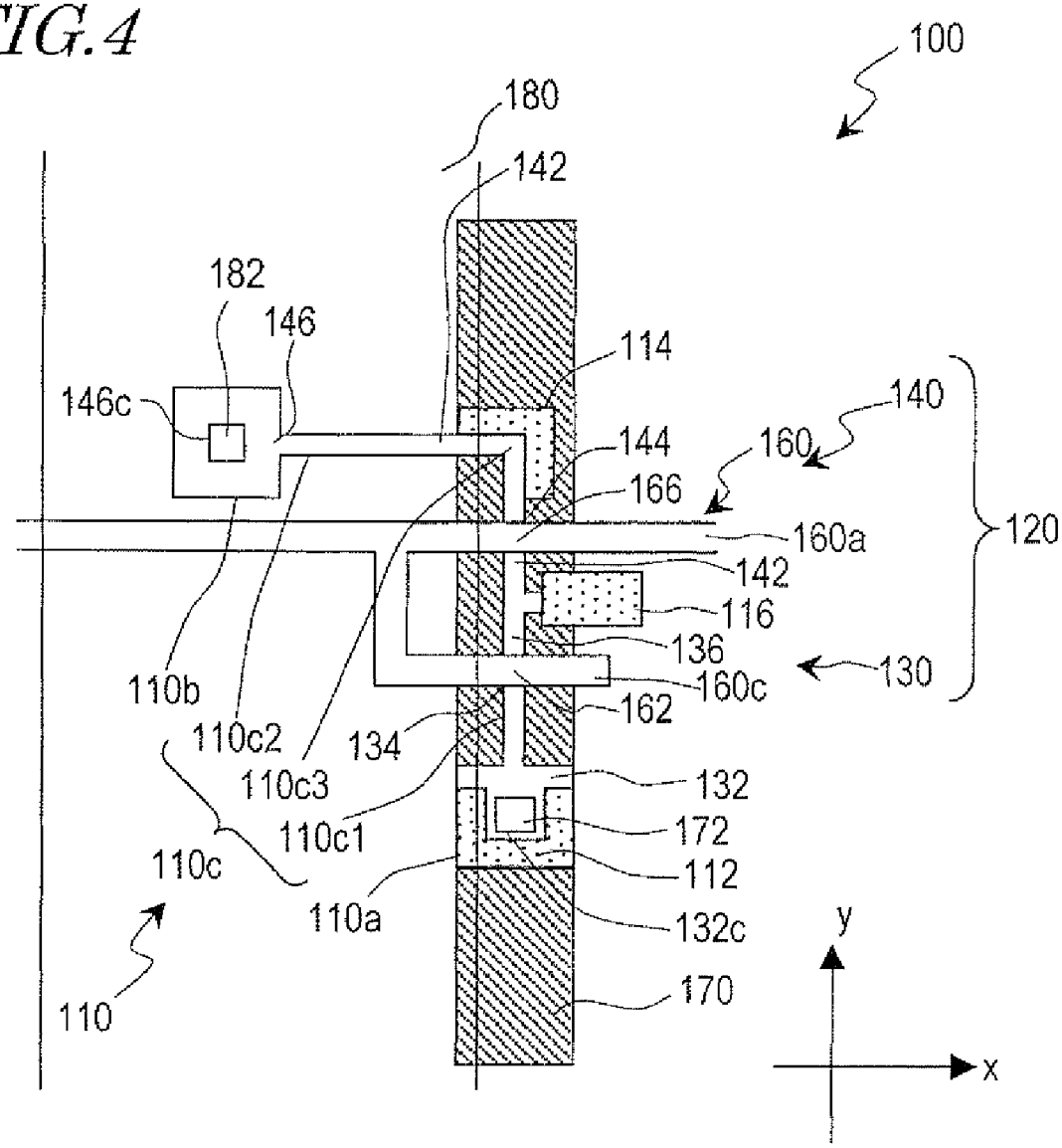
FIG. 4 is a schematic plan view illustrating an active-matrix substrate as a second specific preferred embodiment of the present invention.

Hereinafter, a second preferred embodiment of an active-matrix substrate according to the present invention will be described with reference to FIG. 4. As shown in FIG. 4, in the active-matrix substrate 100 of this preferred embodiment, the TFT element 120 includes only two TFTs 130 and 140.

The gettering region 116 is arranged between the respective channel regions 134 and 144 of the TFTs 130 and 140. That is why the catalyst element remaining in those channel regions 134 and 144 can be removed efficiently by performing a gettering process.

The gettering region 114 is arranged adjacent to the drain region 146 of the TFT 140. However, the gettering region 114 is not located around the drain contact portion 146c but adjacent to the connecting portion 110c3. By arranging the gettering region 114 at such a location, the gettering performance will hardly decline even without providing any gettering region around the drain contact portion 146c. As a result, the second end portion 110b can be designed more flexibly.

Also, the semiconductor layer 110 has three gettering regions 112, 114 and 116, each of which overlaps with the source bus line 170 at least partially. That is why a black matrix provided for the source bus line 170 can also be used for the gettering regions 112, 114 and 116 and a decrease in aperture ratio can be suppressed.

Furthermore, in a situation where a gettering region is arranged near the drain electrode 182, if a gettering element were left in the gate insulating film 194 (see FIGS. 1(a) and 1(b)) near the drain electrode 182, then leakage current would flow between the gate bus line 160 and the pixel electrode 180 by way of the gettering element and the drain electrode 182, thus possibly producing a point defect on a display device. In the active-matrix substrate 100 of this preferred embodiment, however, no gettering regions are arranged around the drain electrode 182 that is located relatively close to the gate bus line 160. As a result, it is possible to prevent such leakage current from flowing between the gate bus line 160 and the pixel electrode 180.

(Embodiment 3)

Figure 5:
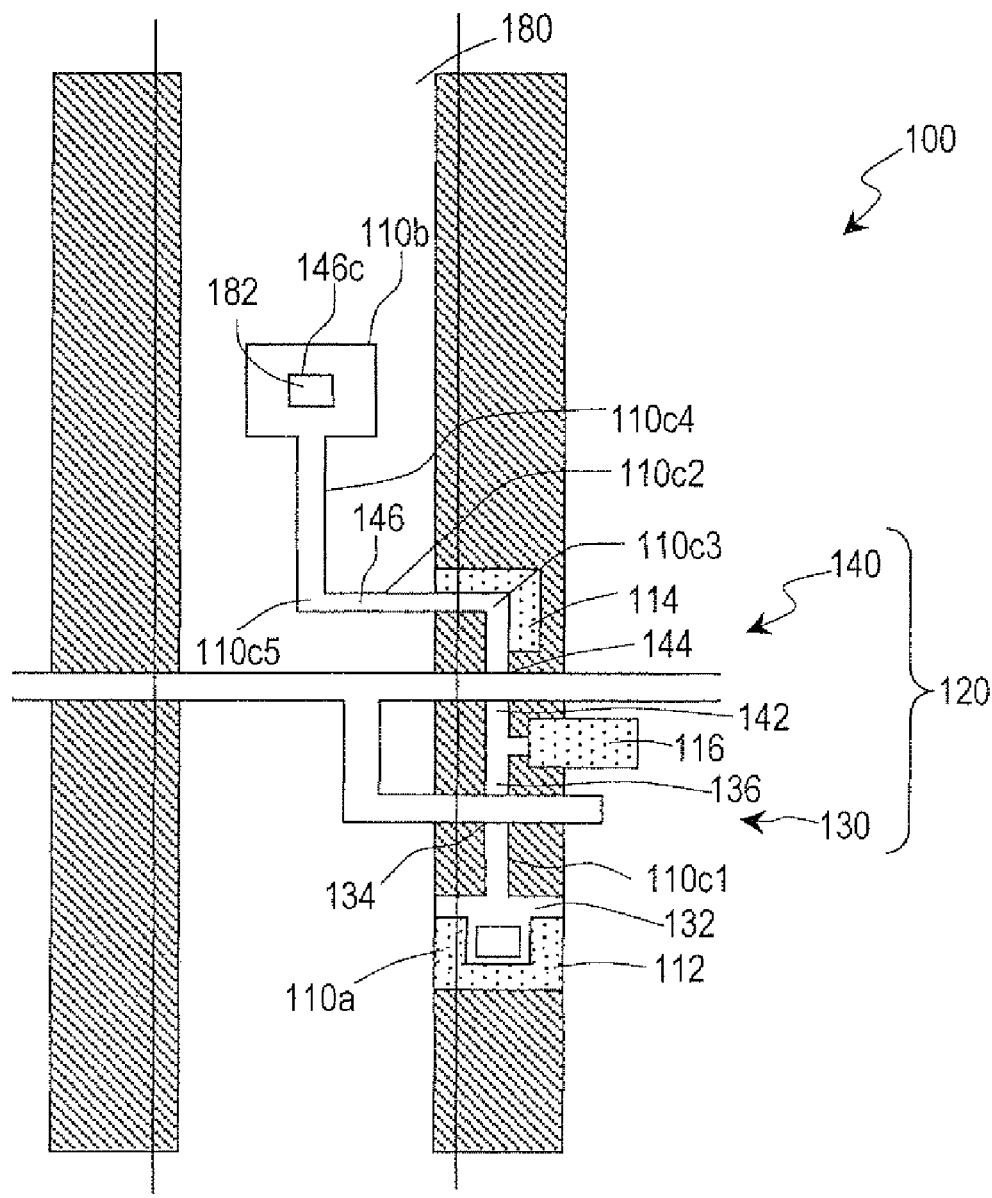
FIG. 5 is a schematic plan view illustrating an active-matrix substrate as a third specific preferred embodiment of the present invention.

Hereinafter, a third preferred embodiment of an active-matrix substrate according to the present invention will be described with reference to FIG. 5. As shown in FIG. 5 in the active-matrix substrate 100 of this preferred embodiment, the gettering region 116 is arranged between the respective channel regions 134 and 144 of the TFTs 130 and 140. That is why the catalyst element remaining in those channel regions 134 and 144 can be removed efficiently by performing a gettering process.

The TFT element 120 includes only two TFTs 130 and 140. Also, the semiconductor layer 110 has three gettering regions 112, 114 and 116, each of which overlaps with the source bus line 170 at least partially. That is why a black matrix provided for the source bus line 170 can also be used for the gettering regions 112, 114 and 116 and a decrease in aperture ratio can be suppressed.

The semiconductor layer 110 has not only the first and second linear portions 110c1 and 110c2 running in the y and x directions, respectively, but also a third linear portion 110c4 extending from one end of the second linear portion 110c2 in the y direction and a connecting portion 110c5 between the second and third linear portions 110c2 and 110c4. The third linear portion 110c4 includes a drain contact portion 146c in contact with the drain electrode 182 that is electrically connected to the pixel electrode 180. In this manner, the drain electrode 182 is arranged away from the gate bus line 160 and the source bus line 170, thus minimizing the leakage current that could flow between the gate bus line 160 and the source bus line 170. In addition, the length of the semiconductor layer 110 in the x direction can be reduced, thus realizing finer pixels.

(Embodiment 4)

Figure 6:
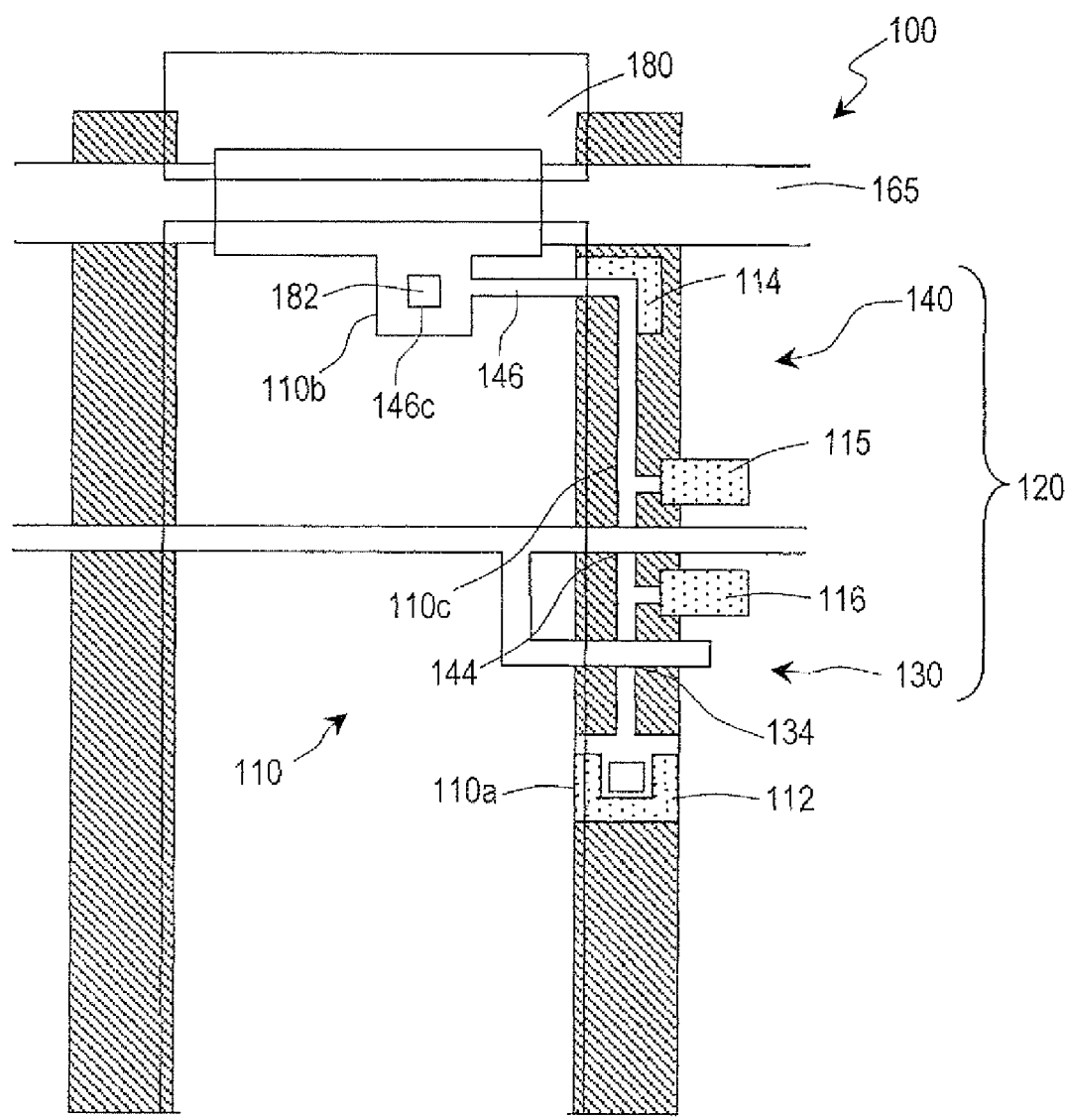
FIG. 6 is a schematic plan view illustrating an active-matrix substrate as a fourth specific preferred embodiment of the present invention.

Hereinafter, a fourth preferred embodiment of an active-matrix substrate according to the present invention will be described with reference to FIG. 6. As shown in FIG. 6, the active-matrix substrate 100 of this preferred embodiment includes a storage capacitor bus line 165, which is arranged parallel to the gate bus line 160 and the semiconductor layer 110 is arranged so as to partially overlap with the storage capacitor bus line 165. Since the drain electrode 182 that is electrically connected to the pixel electrode 180 is arranged near the storage capacitor bus line 165, a black matrix provided for the storage capacitor bus line 165 can also be used for the drain electrode 182. Consequently, a decrease in aperture ratio can be suppressed.

In the active-matrix substrate 100 of this preferred embodiment, the TFT element 120 includes only two TFTs 130 and 140. There is no gettering region around the drain contact portion 146c and the drain region 146 of the TFT 140 is relatively long. However, there are two gettering regions 114 and 115 adjacent to the drain region 146 of the TFT 140. That is why the catalyst element remaining in the drain region 146 of the TFT 140 can be removed efficiently by performing a gettering process. Also, the gettering region 116 is arranged near the channel region 134 and the gettering regions 115 and 116 are arranged near the channel region 144. As a result, the catalyst element remaining in the channel regions 134 and 144 can be removed efficiently by performing a gettering process.

The semiconductor layer 110 has these four gettering regions 112, 114, 115 and 116, each of which overlaps with the source bus line 170 at least partially. Thus, a black matrix provided for the source bus line 170 can also be used for these gettering regions 112, 114, 115 and 116. Consequently, a decrease in aperture ratio can be suppressed.

In the foregoing description, the display device that uses the active-matrix substrate is supposed to be a liquid crystal display device. However, the present invention is in no way limited to those specific preferred embodiments. Any other arbitrary display device such as a CRT, a plasma display panel (PDP), an organic EL, an SED or a liquid crystal projector, may also use the active-matrix substrate.

The entire disclosure of Japanese Patent Application No. 2007-69141, on which the present application claims priority, is hereby incorporated by reference.

Industrial Applicability

An active-matrix substrate according to the present invention can be used effectively in PC monitors, TV sets, projectors, cellphone displays and various other display devices.

The invention claimed is:

1. An active-matrix substrate comprising:
    a semiconductor layer comprising a first end portion, a second end portion and an intermediate portion between the first and second end portions;
    a thin-film transistor element having a plurality of thin-film transistors including first and second thin-film transistors, each of which has a source region, a channel region and a drain region that are included in the semiconductor layer;
    a gate bus line;
    a source bus line; and
    a pixel electrode,
    wherein the first and second thin-film transistors are arranged in series with each other and the first thin-film transistor is located proximate the fist end portion of the semiconductor layer, while the second thin-film transistor is located proximate the second end portion of the semiconductor layer, and
    wherein the source region of the first thin-film transistor includes a source contact portion, and
    wherein the drain region of the second thin-film transistor includes a drain contact portion, and
    wherein the semiconductor layer has a first gettering region adjacent to the source region of the first thin-film transistor, a second gettering region adjacent to the drain region of the second thin-film transistor, and a third gettering region adjacent to any of the source and drain regions located between the respective channel regions of the first and second thin-film transistors among the source and drain regions of the plurality of thin-film transistors included in the thin-film transistor element,
    wherein the intermediate portion comprises a first linear portion running in a first direction, a second linear portion running in a second direction that is different than the first direction, and a connecting portion that connects the first and second linear portions, and
    wherein the third gettering region is adjacent to the connecting portion, the first linear portion is approximately parallel to the source bus line, and the second linear portion is approximately parallel to the gate bus line.

2. The active-matrix substrate of claim 1, wherein at least the first linear portion of the semiconductor layer overlaps with the source bus line.

3. The active-matrix substrate of claim 1, wherein at least a part of the third gettering region overlaps with the source bus line.

4. The active-matrix substrate of claim 1, wherein a part of the source region of the first thin-film transistor and the first gettering region are located in the first end portion.

5. The active-matrix substrate of claim 1, wherein a part of the drain region of the second thin-film transistor is located in the second end portion, and
    wherein a part of the source region and the entire channel and drain regions of the first thin-film transistor and a part of the drain region and the entire channel and source regions of the second thin-film transistor are located in the intermediate portion, and
    wherein the second gettering region is located in the second end portion and the third gettering region is located in the intermediate portion.

6. The active-matrix substrate of claim 1, wherein a part of the drain region of the second thin-film transistor is located in the second end portion, and
    wherein a part of the source region and the entire channel and drain regions of the first thin-film transistor and a part of the drain region and the entire channel and source regions of the second thin-film transistor are located in the intermediate portion, and
    wherein the second and third gettering regions are both located in the intermediate portion.

7. The active matrix substrate of claim 1, wherein a width of the connecting portion of the semiconductor layer is greater than widths of the first and second linear portions.

* * * * *